US012615037B2

(12) United States Patent
Hsu

(10) Patent No.: US 12,615,037 B2
(45) Date of Patent: Apr. 28, 2026

(54) MULTI-MASTER CONTROL CIRCUIT

(71) Applicant: MITAC COMPUTING TECHNOLOGY CORPORATION, Taoyuan City (TW)

(72) Inventor: Chun-Chu Hsu, Taoyuan City (TW)

(73) Assignee: MITAC COMPUTING TECHNOLOGY CORPORATION, Taoyuan City (TW)

( * ) Notice: Subject to any disclaimer, the term of this patent is extended or adjusted under 35 U.S.C. 154(b) by 74 days.

(21) Appl. No.: 18/929,257

(22) Filed: Oct. 28, 2024

(65) Prior Publication Data

US 2025/0379561 A1      Dec. 11, 2025

(30) Foreign Application Priority Data

Jun. 5, 2024      (TW) ................................. 113120915

(51) Int. Cl.
*H03K 3/037*          (2006.01)
*H03K 17/687*          (2006.01)

(52) U.S. Cl.
CPC ........... *H03K 3/037* (2013.01); *H03K 17/687* (2013.01)

(58) Field of Classification Search
CPC .............................. H03K 3/037; H03K 17/687
See application file for complete search history.

(56) References Cited

U.S. PATENT DOCUMENTS

| | | | | |
|---|---|---|---|---|
| 6,690,219 B2 * | 2/2004 | Chuang | ................ | H03L 7/0814 |
| | | | | 327/407 |
| 6,941,496 B2 * | 9/2005 | Kim | ................ | G01R 31/31835 |
| | | | | 714/724 |
| 12,088,305 B2 * | 9/2024 | Culca | ................... | H03K 5/1536 |
| 2008/0320247 A1 * | 12/2008 | Morfey | ................... | G06F 9/324 |
| | | | | 714/E11.053 |
| 2020/0393499 A1 * | 12/2020 | Culca | ..................... | H03K 5/153 |
| 2022/0224319 A1 * | 7/2022 | Culca | ................... | H03K 5/1536 |
| 2025/0062752 A1 * | 2/2025 | Park | ................... | G01R 31/3177 |
| 2025/0379561 A1 * | 12/2025 | Hsu | ........................ | H03K 3/037 |

FOREIGN PATENT DOCUMENTS

WO      WO-2020193282 A1 * 10/2020 ............. H03K 19/21

* cited by examiner

*Primary Examiner* — Menatoallah Youssef
*Assistant Examiner* — Khareem E Almo
(74) *Attorney, Agent, or Firm* — RABIN & BERDO, P.C.

(57) ABSTRACT

A multi-master control circuit includes signal switch, D-type flip-flop, and multiplexer. The signal switch outputs switching signals based on a first control signal generated by a first processor or a second control signal generated by a second processor. The D-type flip-flop includes clock input, signal input, signal output, and inverted signal output. The clock input is coupled to the signal switch to receive the switching signals, and the inverted signal output is coupled to the signal input. Upon triggering by the switching signals, the signal output of the D-type flip-flop generates a selection signal. The multiplexer receives a first access signal generated by the first processor and a second access signal generated by the second processor. The multiplexer is coupled to the signal output of the D-type flip-flop to receive the selection signal and output either the first access signal or the second access signal based on the selection signal.

20 Claims, 5 Drawing Sheets

| State | Input | | | | Output | |
|:---:|:---:|:---:|:---:|:---:|:---:|:---:|
| | $\overline{PRE}$ | $\overline{CLR}$ | CLK | D | Q | $\overline{Q}$ |
| 1 | H/L | L | H/L | H/L | L | H |
| 2 | H | H | L | H/L | L | H |
| 3 | H | H | L->H | H | H | L |
| 4 | H | H | L->H | L | L | H |

FIG. 3

MULTI-MASTER CONTROL CIRCUIT

CROSS-REFERENCE TO RELATED APPLICATION

This non-provisional application claims priority under 35 U.S.C. § 119(a) to patent application No. 113120915 filed in Taiwan, R.O.C. on Jun. 5, 2024, the entire contents of which are hereby incorporated by reference.

BACKGROUND

Technical Field

The present disclosure relates to a hardware control circuit, and in particular, to a hardware control circuit suitable for coupling multiple master control terminals.

Related Art

In a conventional method for controlling a line status in a multi-master general-purpose input/output (GPIO) mode on a server or a computer motherboard, two master control terminals are usually electrical connected in order to control GPIO pins of a switch, and to ensure that both master control terminals can control the switch via the GPIO pins. However, this method has a problem that if a line status is changed by one master control terminal, the other master control terminal cannot control the switch anymore.

For example, for reading of a temperature of a DIMM, when both a baseboard management controller and a central processing unit obtain the temperature via a serial presence detect (SPD) system busbar on the DIMM, a switching control pin of the baseboard management controller is electrically connected to a switching control pin of the central processing unit, to jointly control the switch to selectively electrically connect the SPD system busbar on the DIMM to the baseboard management controller or the central processing unit.

However, this conventional method has a specific limitation. Since the switching control pin of the baseboard management controller is electrically connected to the switching control pin of the central processing unit, when one processing end (the baseboard management controller or the central processing unit) switches the SPD busbar to be electrically connected to the central processing unit for access, but does not release/recover a preset voltage level at the corresponding switching control pin upon completing processing, the other processing end cannot perform access, resulting in a system failure or even damage.

SUMMARY

In view of this, the present disclosure proposes a multi-master control circuit applicable to a motherboard. The multi-master control circuit is coupled to a first processor and a second processor. The multi-master control circuit includes a signal switch, a D-type flip-flop, and a multiplexer. The signal switch receives a first control signal generated by the first processor and a second control signal generated by the second processor, and outputs switching signals based on the first control signal and the second control signal. The D-type flip-flop includes clock input, signal input, signal output, and inverted signal output. The clock input is coupled to the signal switch to receive the switching signals. The inverted signal output is coupled to the signal input. Upon triggering by the switching signals, the signal output of the D-type flip-flop generates a selection signal. The multiplexer receives a first access signal generated by the first processor and a second access signal generated by the second processor. The multiplexer is coupled to the signal output of the D-type flip-flop to receive the selection signal and output either the first access signal or the second access signal based on the selection signal.

The present disclosure further proposes another multi-master control circuit applicable to a motherboard. The multi-master control circuit includes a first processor, a second processor, a signal switch, a D-type flip-flop, and a multiplexer. The first processor receives a feedback signal, and determines, based on the feedback signal, whether to generate a first control signal. The second processor receives the feedback signal, and determines, based on the feedback signal, whether to generate a second control signal. The signal switch receives the first control signal and the second control signal, and outputs switching signals based on the first control signal and the second control signal. The D-type flip-flop includes clock input, signal input, signal output, and inverted signal output. The clock input is coupled to the signal switch to receive the switching signals. The inverted signal output is coupled to the signal input, the first processor, and the second processor. Upon triggering by the switching signals, the signal output of the D-type flip-flop generates a selection signal, and the inverted signal output generates the feedback signal. The multiplexer receives a first access signal generated by the first processor and a second access signal generated by the second processor. The multiplexer is coupled to the signal output of the D-type flip-flop to receive the selection signal and output either the first access signal or the second access signal based on the selection signal.

BRIEF DESCRIPTION OF THE DRAWINGS

FIG. 3 is a schematic diagram of input/output signal states of a multi-master control circuit according to some embodiments of the present disclosure.

DETAILED DESCRIPTION

Figure 1:
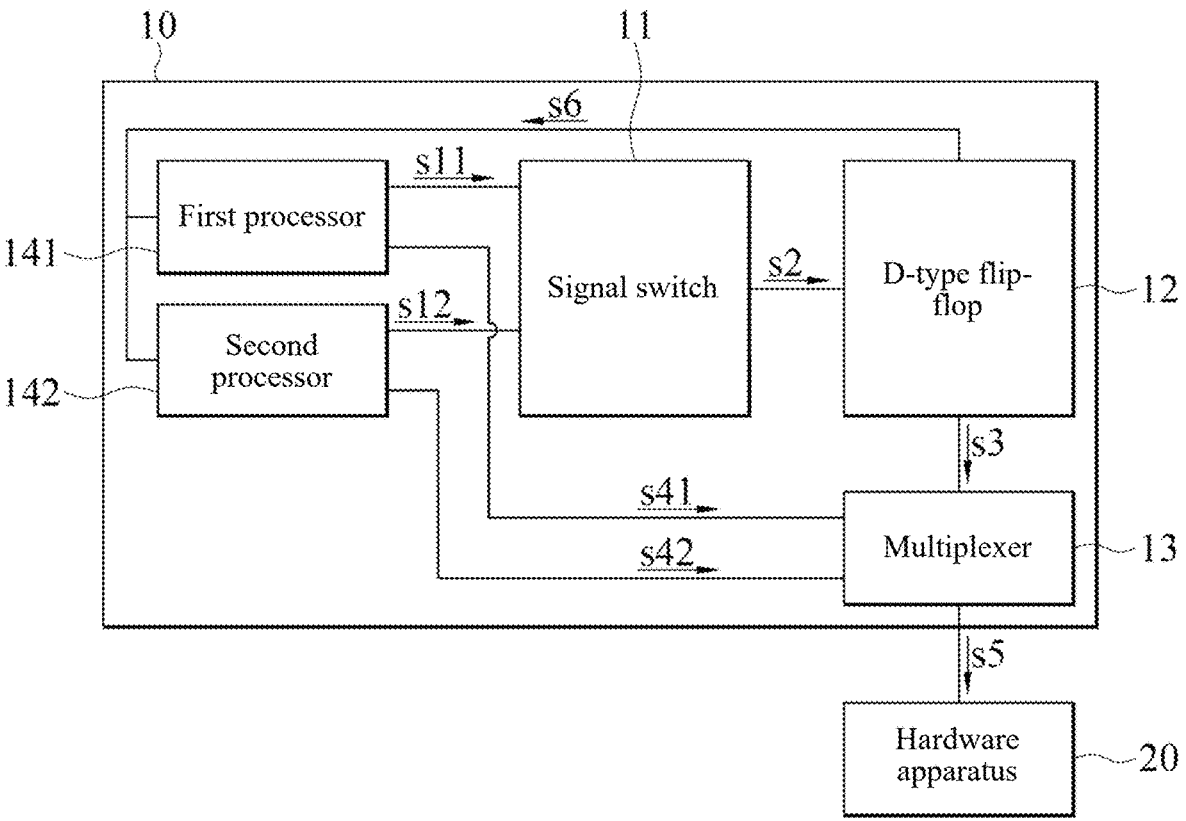
FIG. 1 is a schematic block diagram of a multi-master control circuit according to some embodiments of the present disclosure.

FIG. 1 is a schematic block diagram of a multi-master control circuit according to some embodiments of the present disclosure. Refer to FIG. 1. In this embodiment, the multi-master control circuit 10 includes a signal switch 11, a D-type flip-flop 12, a multiplexer 13, a first processor 141, and a second processor 142. The multi-master control circuit 10 is suitable for accessing a hardware apparatus 20. The first processor 141 and the second processor 142 are coupled to the signal switch 11. The signal switch 11 is coupled to the D-type flip-flop 12. The multiplexer 13 is coupled to the D-type flip-flop 12, the first processor 141, the second processor 142, and the hardware apparatus 20. The multi-master control circuit 10 of a motherboard to which this solution is applicable to a desktop computer, a notebook computer, or a server in some embodiments.

The first processor 141 may be but is not limited to a SoC and a central processing unit (CPU). The second processor 142 may be a baseboard management controller (BMC), a micro-control unit (MCU), an application specific integrated circuit (ASIC), a field programmable gate array (FPGA), a complex programmable logic device (CPLD), or a logic circuit. In some embodiments, a control authority of the first processor 141 is higher than that of the second processor 142, and when the first processor 141 accesses the hardware apparatus 20 and does not release the GPIO control authority, the second processor 142 cannot access the hardware apparatus 20. For example, the first processor 141 is the central processing unit, and the second processor 142 is the baseboard management controller. In this case, the central processing unit is endowed with a higher control authority than the baseboard management controller, so that the control authority of the central processing unit is ensured, to improve system stability.

The hardware apparatus 20 may be a controlled unit, for example, a fan, a motor, or a memory, or may be a sensing unit, for example, a temperature sensor. The multi-master control circuit 10 may be coupled to the hardware apparatus 20 via a system busbar, to send a third access signal s5 to the hardware apparatus 20. The first processor 141 or the second processor 142 may read or write the hardware apparatus 20 via the system busbar.

In this embodiment, the first processor 141 sends a first control signal s11 to the signal switch 11. The second processor 142 sends a second control signal s12 to the signal switch 11. The signal switch 11 correspondingly outputs switching signals s2 based on the first control signal s11 and/or the second control signal s12, and outputs the switching signals s2 to the D-type flip-flop 12. The D-type flip-flop 12 is triggered by the switching signals s2 to correspondingly generate a selection signal s3 and a feedback signal s6, outputs the selection signal s3 to the multiplexer 13, and outputs the feedback signal s6 to the first processor 141 and the second processor 142. A first access busbar of the first processor 141 is electrically connected to the multiplexer 13. A second access busbar of the second processor 142 is electrically connected to the multiplexer 13. The multiplexer 13 determines, in response to the selection signal s3, to electrically connect the first access busbar or the second access busbar to a third access busbar of the hardware apparatus 20. In some other embodiments, the D-type flip-flop 12 is triggered by the switching signals s2 to generate a feedback signal s6, and outputs the feedback signal to the first processor 141 or the second processor 142, and then the processor receiving the feedback signal s6 forwards the feedback signal s6 to the other processor. The first control signal s11 and the second control signal s12 each may be but are not limited to a dynamic potential change, for example, a signal edge of a pulse waveform, that is, a rising edge or a falling edge.

Figure 2:
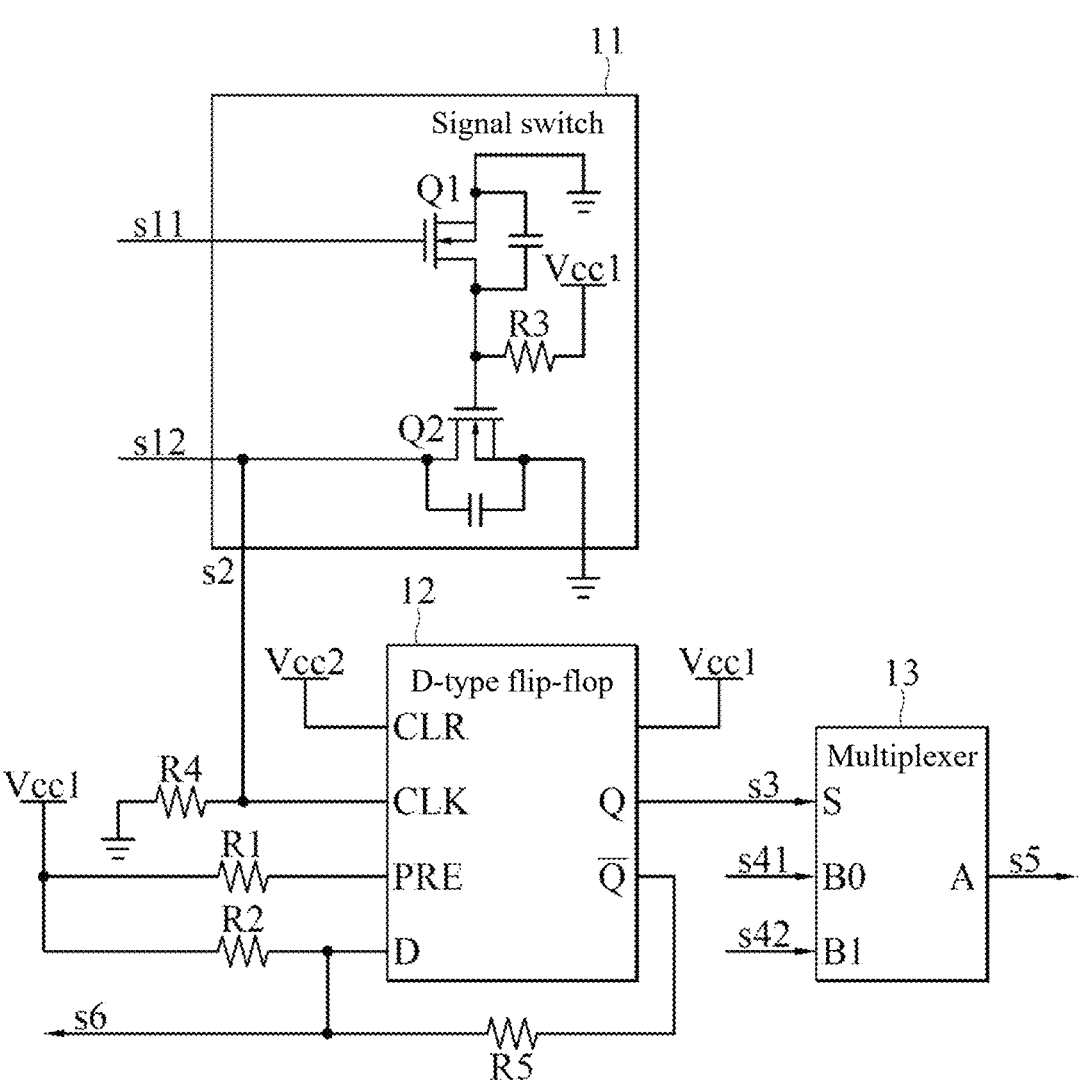
FIG. 2 is a schematic circuit diagram of a multi-master control circuit according to some embodiments of the present disclosure.

FIG. 2 is a schematic circuit diagram of a multi-master control circuit according to some embodiments of the present disclosure. Refer to FIG. 2. In this embodiment, the multi-master control circuit 10 includes a signal switch 11, a D-type flip-flop 12, and a multiplexer 13. The signal switch 11 receives a first control signal s11 and a second control signal s12, and outputs switching signals s2 to clock input CLK of the D-type flip-flop 12. Signal output Q of the D-type flip-flop 12 outputs a selection signal s3 to the multiplexer 13.

In this embodiment, the signal switch 11 includes a switch Q1 and a switch Q2. The switch Q1 and the switch Q2 may be transistors or other electronic switches. The following uses field-effect transistors as an example. A gate terminal of the switch Q1 is coupled to a first processor 141. A gate terminal of the switch Q2 is coupled to the switch Q1. The switch Q2 is coupled to a second processor 142 and the clock input CLK of the D-type flip-flop 12. Therefore, an on/off state of the switch Q2 is controlled in linkage with the switch Q1. When the switch Q2 is off (when the switch Q2 is off, it indicates that a drain terminal and a source terminal of the switch Q2 are not conducted internally), the second control signal s12 is outputted as the switching signal s2; or when the switch Q2 is on (when the switch Q2 is on, it indicates that a drain terminal and a source terminal of the switch Q2 are conducted internally), a status of the second control signal s12 does not affect output of the switching signals s2 by the signal switch 11. For example, as shown in FIG. 2, the switch Q1 and the switch Q2 are N-type field-effect transistors. The gate terminal of the switch Q1 is coupled to the first processor 141 to receive the first control signal s11. A drain terminal of the switch Q1 is coupled to a power supply Vcc1 via a pull-up resistor R3. A source terminal of the switch Q1 is grounded. The gate terminal of the switch Q2 is coupled to the drain terminal of the switch Q1, and is coupled to the power supply Vcc1 via the pull-up resistor R3. The source terminal of the switch Q2 is grounded. The drain terminal of the switch Q2 is coupled to the second processor 142 to receive the second control signal s12. The drain terminal of the switch Q2 is coupled to the clock input CLK of the D-type flip-flop 12. The clock input CLK is coupled to ground via a pull-down resistor R4.

As shown in FIG. 2, output (that is, the switching signals s2) of the signal switch 11 may be controlled by the first control signal s11 and the second control signal s12. The following describes an input/output relationship of the signal switch 11 by using four embodiments.

In a first embodiment, if both the first control signal s11 and the second control signal s12 are at high potential, the high-potential first control signal s11 causes the switch Q1 to be turned on. As a result, the gate terminal of the switch Q2 is pulled down, and the switch Q2 is turned off. When the switch Q2 is off, the high-potential second control signal s12 is outputted as a high-potential switching signal s2.

In a second embodiment, if the first control signal s11 is at high potential, and the second control signal s12 is at low potential, the high-potential first control signal s11 causes the switch Q1 to be turned on. As a result, the gate terminal of the switch Q2 is pulled down, and the switch Q2 is switched off. When the switch Q2 is off, the low-potential second control signal s12 is outputted as a low-potential switching signal s2. Therefore, in the first embodiment and the second embodiment, the first control signal s11 is at high potential, and the signal switch 11 may response to the second control signal s12 and output the second control signal s12 as the switching signal s2.

In a third embodiment, if the first control signal s11 is at low potential, and the second control signal s12 is at high potential, the low-potential first control signal s11 causes the switch Q1 to be turned off. As a result, the gate terminal of the switch Q2 is pulled up by the power supply Vcc1, and the switch Q2 is turned on. When the switch Q2 is on, the drain terminal of the switch Q2 is pulled down by its source terminal, and a low-potential switching signal s2 is outputted.

In a fourth embodiment, if the first control signal s11 is at low potential, and the second control signal s12 is at low potential, the low-potential first control signal s11 causes the switch Q1 to be turned off. As a result, the gate terminal of the switch Q2 is pulled up by the power supply Vcc1, and the switch Q2 is turned on. When the switch Q2 is on, the drain terminal of the switch Q2 is pulled down by its source terminal, and a low-potential switching signal s2 is output-ted. Therefore, in the third embodiment and the fourth embodiment, the first control signal s11 is at low potential, and the signal switch 11 outputs the low-potential switching signal s2 no matter whether the second control signal s12 is at high potential or low potential.

In the third embodiment and the fourth embodiment, when the first processor 141 controls the first control signal s11 to generate a low-potential pulse wave, the signal switch 11 does not respond to the second control signal s12. In addition, the switch Q1 is switched from a preset on state to an off state for a short time due to short-term impact of the low-potential pulse wave of the first control signal s11, so that the switch Q2 that is originally off remains on for a short time and then is switched to be off. Therefore, the switch Q2 outputs the switching signals s2 with a low-potential pulse wave to the D-type flip-flop 12. In some embodiments, when the second processor 142 controls the second control signal s12 to generate a low-potential pulse wave, the switch Q1 remains on because the first control signal s11 is still at a preset high potential, and the drain terminal of the switch Q1 outputs a low potential to the gate terminal of the switch Q2, so that the switch Q2 remains off. Therefore, the second processor 142 outputs the second control signal s12 with the low-potential pulse wave, without impact of grounding of the source terminal of the switch Q2, and the D-type flip-flop 12 directly receives the second control signal s12 that is controlled by the second processor 142 and that has the low-potential pulse wave with a rising edge.

It can be learned from the first to the fourth embodiments, the first control signal s11 outputted by the first processor 141 has a high control authority. When the first control signal s11 generates the low-potential pulse wave, the sec-ond processor 142 cannot access the hardware apparatus 20 no matter whether the second processor outputs a high-potential or low-potential second control signal s12. When the first processor 141 releases the access authority, and sets the first control signal s11 to be at high potential, the second processor 142 can access the hardware apparatus 20.

Refer to FIG. 2. In this embodiment, the D-type flip-flop 12 includes clear input CLR, the clock input CLK, preset input PRE, signal input D, the signal output Q, and inverted signal output Q. The clock input CLK is coupled to the signal switch 11 to receive the switching signals s2. The inverted signal output Q is coupled to the signal input D via a resistor R5. The clock input CLK may be grounded via the pull-down resistor R4, so that the clock input CLK remains at low potential when the switch Q2 is off and the second processor 142 does not output the second control signal s12. The D-type flip-flop 12 is triggered by a rising edge (or a falling edge) of the switching signals s2 to output a logic level at the signal input D to the signal output Q, generate, at the inverted signal output Q, a logic level opposite to that at the signal output Q, and feedback the logic level to the signal input D. For ease of understanding, the following embodiments are all described by using triggering by the rising edge as an example.

Figure 4:
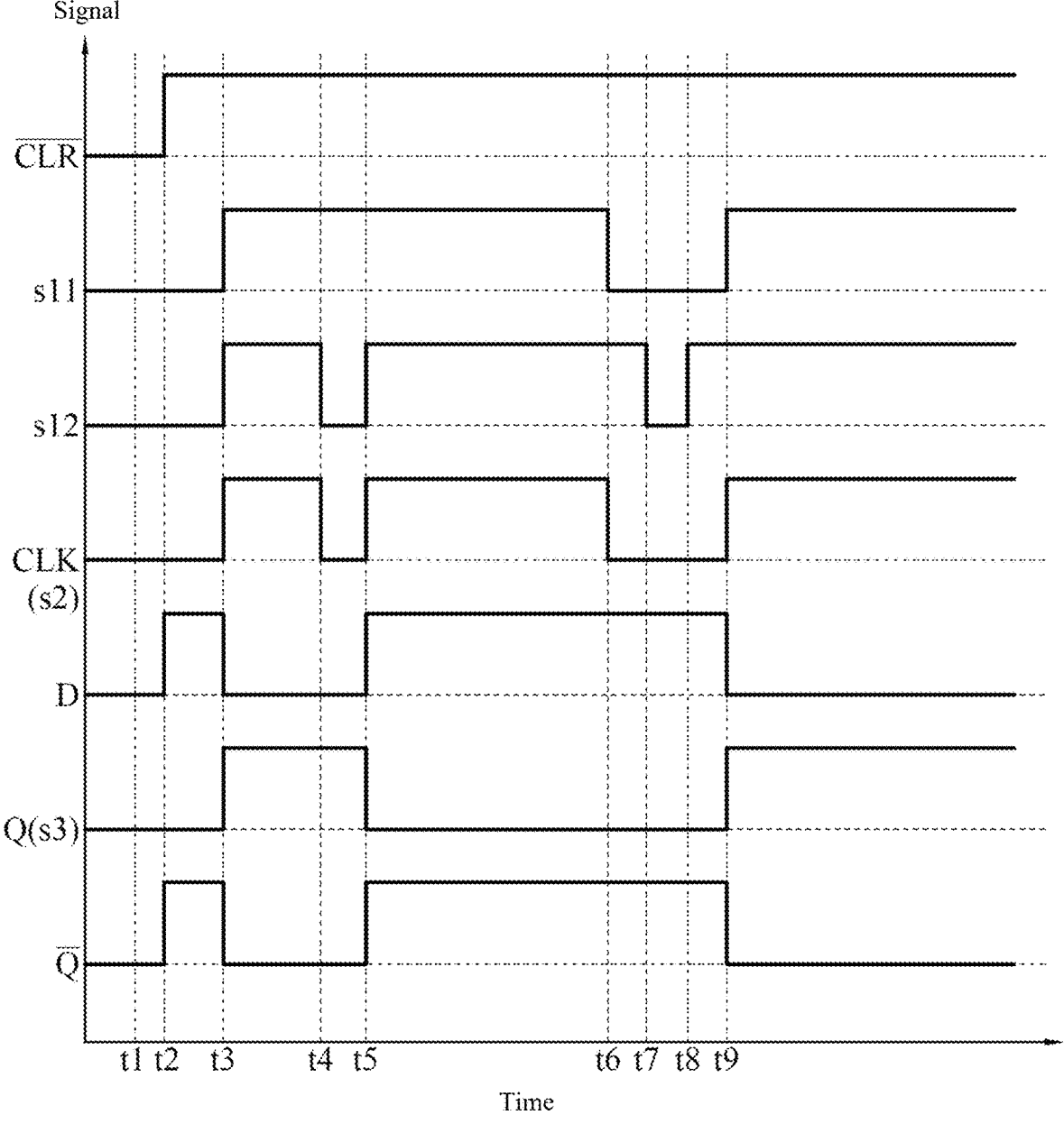
FIG. 4 is a schematic diagram of a sequence signal of a multi-master control circuit according to some embodiments of the present disclosure.

FIG. 3 is a schematic diagram of input/output signal states of the multi-master control circuit according to some embodiments of the present disclosure. FIG. 4 is a schematic diagram of a sequence signal of the multi-master control circuit according to some embodiments of the present disclosure. Refer to FIG. 2 to FIG. 4. At time t1, the multi-master control circuit 10 is just powered on and is under power sequence initialization. At the time t1, the multi-master control circuit 10 is in a state 1 in FIG. 3. In this case, the D-type flip-flop 12 is yet not powered, and the clear input CLR is at low potential (CLR=L), so that the D-type flip-flop 12 cannot change/control an output signal, and the selection signal s3 is at low potential. Therefore, in an embodiment of the state 1, no matter whether the first control signal s11, the second control signal s12, the clock input CLK, the preset input PRE, or the signal input D is at high potential or low potential, the signal output Q outputs a low potential, thereby clearing a temporary storage state.

At time t2, the multi-master control circuit 10 is just powered. At the time t2, the multi-master control circuit 10 is in a state 2 in FIG. 3. In this embodiment, the clear input CLR of the D-type flip-flop 12 is powered to be switched to a high potential. In this case, the first processor 141 and the second processor 142 are also under initialization but have yet not completed initialization, so that the first processor 141 and the second processor 142 are not able to change/control the first control signal s11 and the second control signal s12, and the two signals are at low potential. In another embodiment, even if having completed initialization at the time t2, the first processor 141 and the second processor 142 may remain idle without changing/controlling the first control signal s11 and the second control signal s12, so that the two signals are at low potential. In this case, since both the first control signal s11 and the second control signal s12 are at low potential, the switch Q1 of the signal switch 11 is turned off, and the switch Q2 is turned on. As shown in FIG. 2, the switch Q2 is turned on, so that the clock input CLK of the D-type flip-flop 12 receives the low-potential switching signal s2. Therefore, the D-type flip-flop 12 out-puts a low-potential selection signal s3. It should be noted that at the time t2, the D-type flip-flop 12 is just powered on and the logic level at the signal output Q is a low potential, so that the inverted signal output Q of the D-type flip-flop 12 generates a high potential, which is different from the potential at the signal output Q. The D-type flip-flop 12 feeds back a high-potential signal of the inverted signal output Q to the signal input D of the D-type flip-flop 12. Therefore, the signal input D of the D-type flip-flop 12 receives a high-potential feedback input signal.

At time t3, the clear input CLR has been set to a high potential. At the time t3, the multi-master control circuit 10 is in a state 3 in FIG. 3. In this embodiment, the first processor 141 and the second processor 142 has completed initialization, so that the first processor 141 and the second processor 142 can change the first control signal s11 and the second control signal s12 to a high potential preset after initialization. In this case, as shown in FIG. 2, the switch Q1 of the signal switch 11 is turned on, and the gate terminal of the switch Q2 is switched to a low potential. Since the switch Q2 is off, the drain terminal of the switch Q2 and the ground of the source terminal of the switch Q2 are not conducted. In other words, in this case, the high-potential second control signal s12 is not pulled down under the impact of grounding. Therefore, the clock input CLK of the D-type flip-flop 12 is controlled by the switching signals s2 gener-ated based on the second control signal s12. In other words, at the time t3, the clock input CLK of the D-type flip-flop 12 is switched from a low potential to a high potential in response to the second control signal s12, and a rising signal edge occurs, so that the D-type flip-flop 12 is triggered to output the logic level at the signal input D to the signal output Q. At the time t2, the logic level at the signal input D of the D-type flip-flop 12 is a high potential. Therefore, at the time t3, the signal output Q of the D-type flip-flop 12 generates a high-potential selection signal s3. In addition, the inverted signal output Q̄ of the D-type flip-flop 12 generates a low potential different from that at the signal output Q. The D-type flip-flop 12 feeds back a low-potential signal of the inverted signal output Q̄ to the signal input D of the D-type flip-flop 12. Therefore, the signal input D of the D-type flip-flop 12 receives a low-potential feedback input signal.

At time t4, one of the first processor 141 and the second processor 142 starts to generate and output a low-potential pulse wave. The following uses an example in which the second processor 142 starts to generate a second control signal s12 with a low-potential pulse wave. As shown in FIG. 2, the first control signal s11 remains at high potential, so that the switch Q1 of the signal switch 11 is turned on, and the gate terminal of the switch Q2 is switched to a low potential. Since the switch Q2 is off, the drain terminal of the switch Q2 and the ground of the source terminal of the switch Q2 are not conducted. Therefore, the clock input CLK of the D-type flip-flop 12 is controlled by the switching signals s2 generated based on the second control signal s12. In other words, at the time t4, the signal switch 11 receives the second control signal s12 with the low-potential pulse wave and then outputs switching signals s2 with a low-potential pulse wave, so that the clock input CLK is at low potential. In this case, the D-type flip-flop 12 has yet not been triggered, and remains in the state 3, like at the time t3. Therefore, the logic level at the signal output Q remains the same as the logic level at the time t3, that is, a high potential. Therefore, the D-type flip-flop 12 outputs a high-potential selection signal s3 in the embodiments related to the time t3 and the time t4.

At time t5, the second processor 142 controls the second control signal s12 for potential switching, to finish outputting the low-potential pulse wave, so that the second control signal s12 includes a rising edge. Therefore, the switching signals s2 synchronously outputted by the signal switch 11 are a part of the low-potential pulse wave with a rising edge. In other words, the switching signals s2 are switched from a low potential to a high potential. Therefore, the D-type flip-flop 12 is triggered to output the logic level at the signal input D to the signal output Q. At the time t5, the multi-master control circuit 10 is in a state 4 in FIG. 3. In other words, the D-type flip-flop 12 is triggered by the switching signals s2 including the rising edge part to be switched to the state 4 at the time t5. Since the signal input D is at low potential at the t4, the signal output Q of the D-type flip-flop 12 outputs a low-potential selection signal s3, and the inverted signal output Q̄ outputs a high potential. When the inverted signal output Q̄ outputs the high potential, the signal input D is also set to a high potential. Therefore, when the D-type flip-flop 12 receives, in the state 4 via the clock input CLK of the D-type flip-flop, the switching signals s2 having the low-potential pulse wave with the rising edge, since the D-type flip-flop 12 receives a low-potential feedback signal at the time t4 via the signal input D, the signal output Q of the D-type flip-flop 12 outputs the low-potential selection signal s3. In addition, a status of the D-type flip-flop 12 is also switched from the state 4 to the state 3 in FIG. 3, and by parity of reasoning, each time the signal switch 11 is controlled by one of the first processor 141 and the second processor 142 to generate a complete low-potential pulse wave with a rising edge, the D-type flip-flop 12 is triggered to switch a potential outputted by the signal output Q of the D-type flip-flop at that time.

At time t6, the first processor 141 generates a first control signal s11 with a low-potential pulse wave. As shown in FIG. 2, the first control signal s11 is switched to a low potential, so that the switch Q1 of the signal switch 11 is turned off, and the gate terminal of the switch Q2 is pulled up to a high potential. Since the switch Q2 is on, the drain terminal of the switch Q2 and the ground of the source terminal of the switch Q2 are conducted, and the drain terminal of the switch Q2 is pulled down to a low potential. Therefore, the clock input CLK of the D-type flip-flop 12 is controlled by the switching signals s2 generated based on the first control signal s11. In other words, at the time t6, the signal switch 11 receives a first control signal s11 with a low-potential pulse wave and then outputs switching signals s2 with a low-potential pulse wave, so that the clock input CLK is at low potential. In this case, the signal switch 11 has yet not finished outputting the complete low-potential pulse wave, so that the switching signals s2 do not have a rising edge. Therefore, the D-type flip-flop 12 has yet not been triggered by the rising edge, and the logic level at the signal output Q is the same as the logic level at the time t5 (in the state 4), that is, a low potential.

At time t7, the second processor 142 generates a second control signal s12 with a low-potential pulse wave. As described in the embodiment related to the time t6, since the switch Q2 is on, the drain terminal of the switch Q2 and the ground of the source terminal of the switch Q2 are conducted, and the drain terminal of the switch Q2 is pulled down to a low potential. In this case, the logic level at the clock input CLK of the D-type flip-flop 12 is not affected by the second control signal s12 even if the second control signal s12 is switched from a high potential to a low potential. Therefore, the clock input CLK of the D-type flip-flop 12 is controlled by the switching signals s2 generated based on the first control signal s11. In other words, from the t6 to the time t7, the signal switch 11 receives a first control signal s11 with a partial low-potential pulse wave and then outputs switching signals s2 with an incomplete low-potential pulse wave (a partial low-potential pulse wave without a rising edge), so that the clock input CLK remains at low potential. In this case, the D-type flip-flop 12 has yet not been triggered by the rising edge, and the logic level at the signal output Q is the same as the logic level at the time t5 (in the state 4), that is, a low potential.

At time t8, the second processor 142 controls the second control signal s12 to transmit a low-potential pulse wave including a rising edge. As described in the embodiment related to the time t7, since the switch Q2 is on, the drain terminal of the switch Q2 and the ground of the source terminal of the switch Q2 are conducted, and the drain terminal of the switch Q2 is pulled down to a low potential. In this case, the logic level at the clock input CLK of the D-type flip-flop 12 is not affected by the second control signal s12 even if the second control signal s12 is switched from a low potential to a high potential. Therefore, the clock input CLK of the D-type flip-flop 12 is controlled by the switching signals s2 generated based on the first control signal s11, to remain at low potential. In other words, when the first control signal s11 is at low potential, the D-type flip-flop 12 is not triggered for state switching even if the second control signal s12 generates a low-potential pulse wave with a rising edge. In this case, the D-type flip-flop 12 has yet not been triggered, and the logic level at the signal output Q is the same as the logic level at the time t5 (in the state 4), that is, a low potential.

At time t9, the first processor 141 finishes outputting the low-potential pulse wave, and controls the first control signal s11 for potential switching, so that the first control signal s11 includes a rising edge, to form a complete low-potential pulse wave. Therefore, the signal switch 11 outputs switching signals s2 including a partial low-potential pulse wave with a rising edge. In other words, the switching signals s2 are switched from a low potential to a high potential. Therefore, the D-type flip-flop 12 is triggered to output, to the signal output Q, high-potential logic level fed back to the signal input D through switching at the time t5, and the signal output Q that is originally at low potential is switched to a high potential. In other words, the multi-master control circuit 10 is switched to the state 3 in FIG. 3 at the time t9. Since the signal input D is at high potential at the t8 under impact of switching of the signal output to output a low potential at the time t5, the signal output Q of the D-type flip-flop 12 outputs a high-potential selection signal s3, and the inverted signal output $\overline{Q}$ outputs a low potential as a reference used when the D-type flip-flop 12 is triggered by a rising edge signal next time. When the inverted signal output Q outputs the low potential, the signal input D is also set to a low potential. Therefore, when the D-type flip-flop 12 receives, in the state 3 via the clock input CLK of the D-type flip-flop, the switching signals s2 having the low-potential pulse wave with the rising edge, since the D-type flip-flop 12 receives a high-potential feedback signal at the time t8 via the signal input D, the signal output Q of the D-type flip-flop 12 outputs the high-potential selection signal s3. In addition, the status of the D-type flip-flop 12 is also switched from the state 3 to the state 4 in FIG. 3.

Then, when the first processor 141 controls the first control signal s11 or the second processor 142 controls the second control signal s12 to generate a low-potential pulse wave, the signal switch 11 generates (or does not generate, for example, in the embodiment related to the time t8) switching signals s2 having a low-potential pulse wave in response to the low-potential pulse wave generated by any one of the first control signal s11 and the second control signal s12, and the D-type flip-flop 12 is triggered by the switching signals s2 having the low-potential pulse wave with a rising edge to change the selection signal s3 outputted by the D-type flip-flop, and is switched between the state 3 and the state 4.

Refer to FIG. 2. In this embodiment, the multiplexer 13 includes selection input S, first signal input B0, second signal input B1, and signal output A. The first signal input B0 of the multiplexer 13 receives a first access signal s41 generated by the first processor 141. The second signal input B1 receives a second access signal s42 generated by the second processor 142. The selection input S of the multiplexer 13 receives the selection signal s3 outputted by the D-type flip-flop 12, and switch a connection status between the first signal input B0 or the second signal input B1 and the signal output A based on the selection signal s3, to output the first access signal s41 or the second access signal s42 as a third access signal s5. For example, when the selection input S is at low potential, the multiplexer 13 outputs the first access signal s41 as the third access signal s5; or when the selection input S is at high potential, the multiplexer 13 outputs the second access signal s42 as the third access signal s5. In some other embodiments, when the selection input S is at low potential, the multiplexer 13 outputs the second access signal s42 as the third access signal s5; or when the selection input S is at high potential, the multiplexer 13 outputs the first access signal s41 as the third access signal s5. Therefore, in some embodiments, no matter whether the first processor 141 sends a first control signal s11 with a square-wave pulse or the second processor 142 sends a second control signal s12 with a square-wave pulse, a logic level of the third access signal s5 outputted by the multiplexer 13 is changed. In some embodiments, when the first processor 141 sends a first control signal s11 that remains at low potential (a control authority is maintained), the logic level of the third access signal s5 outputted by the multiplexer 13 is fixed, and cannot be regulated by the second processor 142.

In some embodiments, the multi-master control circuit 10 includes a power supply that powers the signal switch 11 and the clear input $\overline{CLR}$ of the D-type flip-flop 12. For example, refer to FIG. 2. The power supply Vcc1 powers the signal switch 11 and the D-type flip-flop 12, and a power supply Vcc2 powers the clear input $\overline{CLR}$ of the D-type flip-flop 12. The power supply Vcc2 is sourced from the power supply Vcc1. The power supply Vcc2 may be the same as the power supply Vcc1, or may be outputted by the power supply Vcc1 via a voltage regulation circuit, for example, a divider circuit or a transformer circuit. In this embodiment, when a power system is in a state S5 (a soft off state), a low-potential power supply Vcc2 causes the clear input $\overline{CLR}$ to be set to a low potential. Refer to FIG. 3. This may cause the signal output Q of the D-type flip-flop 12 to output a low potential, and switch the multiplexer 13 to the preset signal input D corresponding to the low-potential selection signal s3. For example, the first signal input B0 of the multiplexer 13 receives the first access signal s41 from a central processing unit, the second signal input B1 receives the second access signal s42 from a baseboard management controller, a low-potential selection signal s3 corresponds to the first signal input B0, and a high-potential selection signal s3 corresponds to the second signal input B1. Therefore, when the power system is in the state S5, an access authority over the hardware apparatus 20 is automatically switched to the central processing unit. Similarly, when the power system is powered on to pull the power supply Vcc2 from a low potential up to a high potential, the clear input CLR is pulled from a low potential up to a high potential (refer to FIG. 3 and FIG. 4), which switches, as preset, the access authority over the hardware apparatus 20 to the central processing unit during power-on. After S0 (an operating state), the central processing unit or the baseboard management controller may send the switching signals s2 to adjust a status of the system busbar. In this way, system instability caused by a disorder of a control relationship between the multi-master control circuit 10 and the hardware apparatus 20 is avoided.

Refer to FIG. 2. In this embodiment, the preset input PRE of the D-type flip-flop 12 is coupled to the power supply Vcc1 via a pull-up resistor R1, the signal input D of the D-type flip-flop 12 is coupled to the power supply Vcc1 via a second pull-up resistor R2, and the signal input D of the D-type flip-flop 12 is coupled to the first processor 141 and the second processor 142. Therefore, an output signal of the inverted signal output Q of the D-type flip-flop 12 is simultaneously transmitted to the signal input D of the D-type flip-flop 12, the first processor 141, and the second processor 142. Therefore, the first processor 141 and the second processor 142 can obtain a connection status between the multiplexer 13 and the system busbar based on a feedback signal s6, to further access the hardware apparatus 20.

Figure 5:
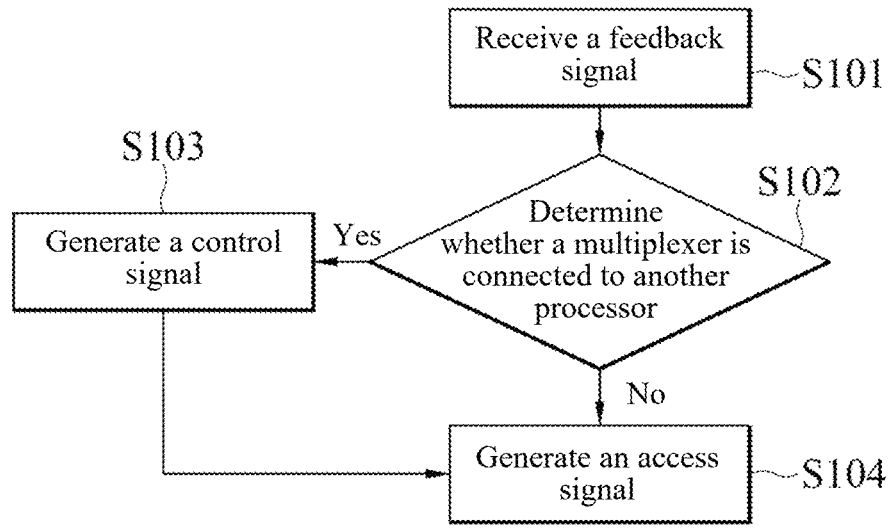
FIG. 5 is a processing flowchart of a processor according to some embodiments of the present disclosure.

FIG. 5 is a processing flowchart of a processor according to some embodiments of the present disclosure. Refer to FIG. 5. The processing flowchart of this embodiment is applicable to the first processor 141 or the second processor 142, which is collectively referred to as the processor below. Upon receiving the feedback signal s6 (step S101), the processor determines whether the multiplexer 13 is connected to another processor (step S102). For example, refer to FIG. 2. The central processing unit sends the first control signal s11, so that the signal output Q of the D-type flip-flop 12 to generate the low-potential selection signal s3, and the multiplexer 13 is switched to the first signal input B0, and outputs the first access signal s41 of the central processing unit as the third access signal s5. In addition, the inverted signal output Q of the D-type flip-flop 12 generates a high-potential feedback signal s6. The baseboard management controller receives the high-potential feedback signal s6, and determines that the multiplexer 13 is currently connected to the central processing unit. The central processing unit receives the high-potential feedback signal s6, and determines that the multiplexer 13 has completed switching. When determining that the multiplexer 13 is connected to the another processor (a determining result obtained in step S102 is "YES"), the processor generates a control signal (step S103) to switch a status of the multiplexer 13, and then generates an access signal (step S104). When determining that the multiplexer 13 is connected to the processor (a determining result obtained in step S102 is "NO"), the processor directly generates an access signal (step S104). In some other embodiments, upon generating the control signal (step S103) to switch the status of the multiplexer 13, the processor returns to step S101 to receive a feedback signal s6 (step S101) and determine whether the multiplexer 13 is connected to another processor (step S102) again. For example, the control authority over the hardware apparatus 20 may be controlled by the first processor 141, and as a result, the multiplexer 13 may not be switched in response to the control signal of the second processor 142. In this case, the second processor 142 needs to confirm, based on the feedback signal s6, that the control authority over the hardware apparatus 20 has been released by the first processor 141, and then generates the second access signal s42 to access the hardware apparatus 20.

Although the present disclosure has been described in considerable detail with reference to certain preferred embodiments thereof, the disclosure is not for limiting the scope of the invention. Persons having ordinary skill in the art may make various modifications and changes without departing from the scope and spirit of the disclosure. Therefore, the scope of the appended claims should not be limited to the description of the preferred embodiments described above.

What is claimed is:

1. A multi-master control circuit, coupled to a first processor and a second processor, wherein the multi-master control circuit comprises:
   a signal switch, receiving a first control signal generated by the first processor and a second control signal generated by the second processor, and outputting switching signals based on the first control signal and the second control signal;
   a D-type flip-flop, comprising clock input, signal input, signal output, and inverted signal output, wherein the clock input is coupled to the signal switch to receive the switching signals, the inverted signal output is coupled to the signal input, and upon triggering by the switching signals, the signal output of the D-type flip-flop generates a selection signal; and
   a multiplexer, receiving a first access signal generated by the first processor and a second access signal generated by the second processor, wherein the multiplexer is coupled to the signal output of the D-type flip-flop to receive the selection signal and output either the first access signal or the second access signal based on the selection signal.

2. The multi-master control circuit according to claim 1, further comprising a power supply, wherein the D-type flip-flop further comprises clear input, and the power supply powers the signal switch and the clear input of the D-type flip-flop.

3. The multi-master control circuit according to claim 2, wherein the D-type flip-flop further comprises preset input coupled to the power supply via a first pull-up resistor, the signal input of the D-type flip-flop is coupled to the power supply via a second pull-up resistor, and the signal input of the D-type flip-flop is coupled to the first processor and the second processor.

4. The multi-master control circuit according to claim 2, further comprising a voltage regulation circuit, wherein input of the voltage regulation circuit is coupled to the power supply, and output of the voltage regulation circuit is coupled to the clear input of the D-type flip-flop.

5. The multi-master control circuit according to claim 1, wherein the first processor is a central processing unit, the second processor is a baseboard management controller, and the signal switch does not response to triggering of the second control signal when triggered by the first control signal to output the switching signals.

6. The multi-master control circuit according to claim 5, wherein the power supply is a power system configured to power the multi-master control circuit and the central processing unit.

7. The multi-master control circuit according to claim 1, wherein the signal switch comprises a first field-effect transistor and a second field-effect transistor, a gate terminal of the first field-effect transistor is coupled to the first processor, a gate terminal of the second field-effect transistor is coupled to the first field-effect transistor, and the second field-effect transistor is coupled to the second processor and the clock input of the D-type flip-flop.

8. The multi-master control circuit according to claim 7, wherein the signal switch comprises a first N-type field-effect transistor and a second N-type field-effect transistor, a gate terminal of the first N-type field-effect transistor is coupled to the first processor, a drain terminal of the first N-type field-effect transistor is coupled to a power supply via a third pull-up resistor, a gate terminal of the second N-type field-effect transistor is coupled to the drain terminal of the first N-type field-effect transistor, a drain terminal of the second N-type field-effect transistor is coupled to the second processor and the clock input of the D-type flip-flop, and the clock input is coupled to ground via a pull-down resistor.

9. The multi-master control circuit according to claim 1, wherein the multiplexer sends the first access signal or the second access signal to a hardware apparatus via a system busbar, and the first processor or the second processor reads or writes the hardware apparatus via the system busbar.

10. The multi-master control circuit according to claim 1, wherein the first control signal and the second control signal are signal edges of a pulse waveform.

11. The multi-master control circuit according to claim 10, wherein the first control signal and the second control signal are rising signal edges of a low-potential pulse waveform.

12. The multi-master control circuit according to claim 1, wherein the multiplexer outputs the first access signal based on a low-potential selection signal, and outputs the second access signal based on a high-potential selection signal.

13. A multi-master control circuit, comprising:

a first processor, receiving a feedback signal, and determining, based on the feedback signal, whether to generate a first control signal;

a second processor, receiving the feedback signal, and determining, based on the feedback signal, whether to generate a second control signal;

a signal switch, receiving the first control signal and the second control signal, and outputting switching signals based on the first control signal and the second control signal;

a D-type flip-flop, comprising clock input, signal input, signal output, and inverted signal output, wherein the clock input is coupled to the signal switch to receive the switching signals, the inverted signal output is coupled to the signal input, the first processor, and the second processor, and upon triggering by the switching signals, the signal output of the D-type flip-flop generates a selection signal, and the inverted signal output generates the feedback signal; and a multiplexer, receiving a first access signal generated by the first processor and a second access signal generated by the second processor, wherein the multiplexer is coupled to the signal output of the D-type flip-flop to receive the selection signal and output either the first access signal or the second access signal based on the selection signal.

14. The multi-master control circuit according to claim 13, wherein the first processor determines, based on the feedback signal, whether the multiplexer is connected to the second processor, and generates the first control signal and the first access signal in sequence when determining that the multiplexer is connected to the second processor.

15. The multi-master control circuit according to claim 14, wherein the second processor determines, based on the feedback signal, whether the multiplexer is connected to the first processor, and generates the second control signal and the second access signal in sequence when determining that the multiplexer is connected to the first processor.

16. The multi-master control circuit according to claim 14, wherein the second processor determines, based on the feedback signal, whether the multiplexer is connected to the first processor, and continues to receive the feedback signal when determining that the multiplexer is connected to the first processor.

17. The multi-master control circuit according to claim 14, wherein the first processor generates only the first access signal when determining that the multiplexer is connected to the first processor; and the second processor generates only the second access signal when determining that the multiplexer is connected to the second processor.

18. The multi-master control circuit according to claim 13, wherein the first processor receives the feedback signal from the inverted signal output of the D-type flip-flop, and then sends the feedback signal to the second processor.

19. A multi-master control circuit, coupled to a first processor, a second processor, and a multiplexer, wherein the multiplexer is coupled to the first processor and the second processor, and the multi-master control circuit comprises:

a signal switch, receiving a first control signal generated by the first processor and a second control signal generated by the second processor, and outputting switching signals based on the first control signal and the second control signal; and a D-type flip-flop, comprising clock input, signal input, signal output, and inverted signal output, wherein the clock input is coupled to the signal switch to receive the switching signals, the inverted signal output is coupled to the signal input, the signal output is coupled to the multiplexer, and upon triggering by the switching signals, the signal output of the D-type flip-flop generates a selection signal to the multiplexer, to switch an electrical connection relationship between the multiplexer and the first processor or the second processor.

20. The multi-master control circuit according to claim 19, wherein output of the multiplexer is coupled to a hardware apparatus via a system busbar, and the first processor or the second processor is electrically connected to the system busbar via the multiplexer, and reads and writes the hardware apparatus via the system busbar.

* * * * *